United States Patent [19]
Luna

[11] 4,321,532
[45] Mar. 23, 1982

[54] REPAIRABLE SPRING PROBE ASSEMBLY

[76] Inventor: L. Jack Luna, 1868 N. Calle Salto, Thousand Oaks, Calif. 91360

[21] Appl. No.: 80,134

[22] Filed: Sep. 28, 1979

Related U.S. Application Data

[63] Continuation of Ser. No. 887,036, Mar. 16, 1978, abandoned.

[51] Int. Cl.³ .................. G01R 1/06; G01R 31/02
[52] U.S. Cl. .................. 324/158 F; 324/72.5; 324/73 PC; 324/158 P
[58] Field of Search .............. 324/158 P, 158 F, 149, 324/72.5, 73 PC, 73 R; 339/108 TP

[56]  References Cited
U.S. PATENT DOCUMENTS 3,315,163  4/1967  Lutz .................. 339/108 TP
4,105,970  8/1978  Katz .................. 324/158 P
4,132,948  1/1979  Katz .................. 324/158 F

FOREIGN PATENT DOCUMENTS 240097  of 1969  U.S.S.R. .................. 324/158 F

OTHER PUBLICATIONS

Ormond, Jr., D. W.; "High-Temperature . . . "; IBM Tech. Dis. Bull.; vol. 14; No. 2; Jul. 1971; p. 568.

Primary Examiner—Ernest F. Karlsen
Attorney, Agent, or Firm—William W. Haefliger

[57]  ABSTRACT

A spring probe assembly has a contact carrying plunger which is spring urged within a tubular housing, part of the plunger being releasably retained in the tubular housing.

11 Claims, 9 Drawing Figures

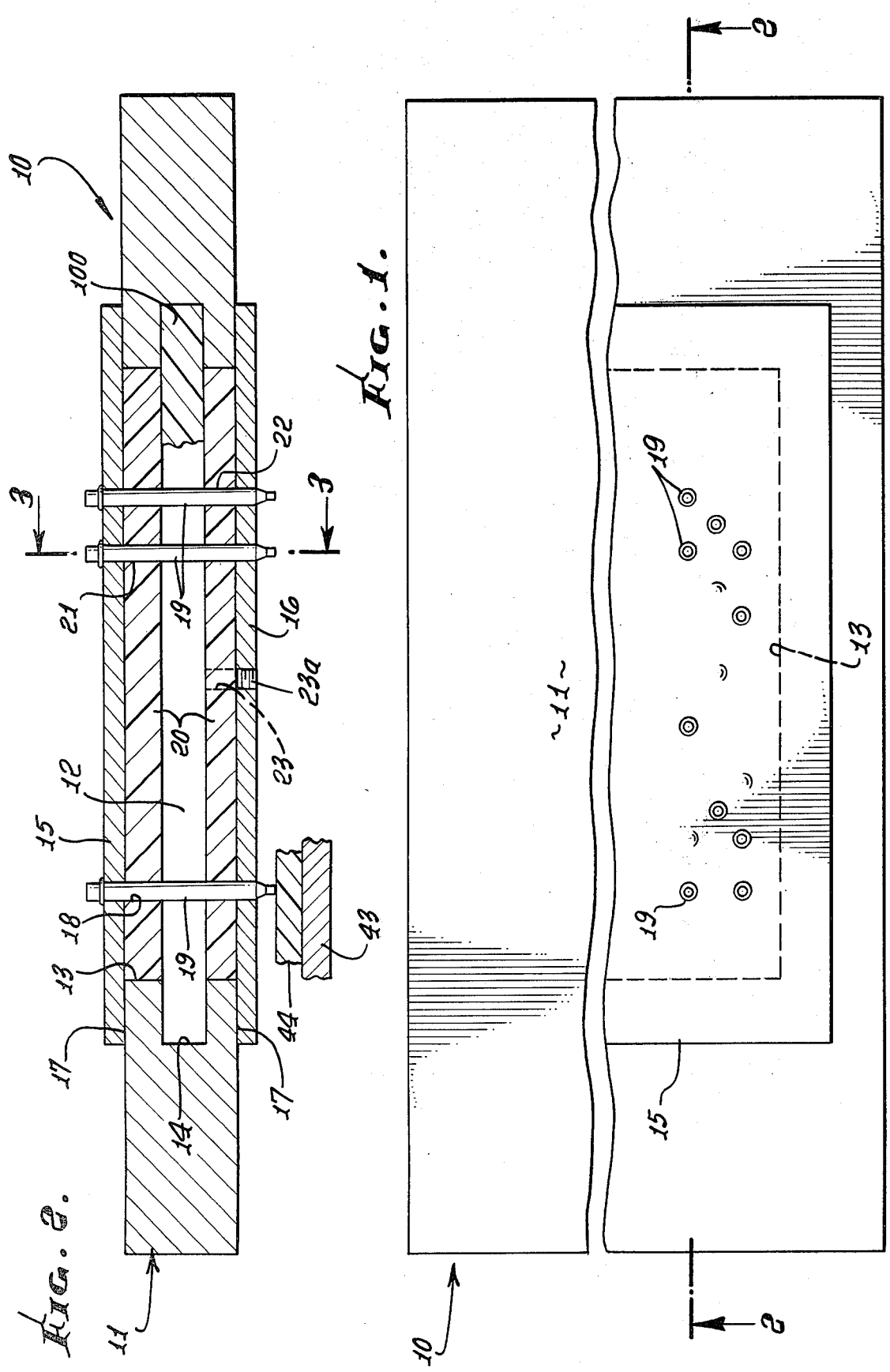

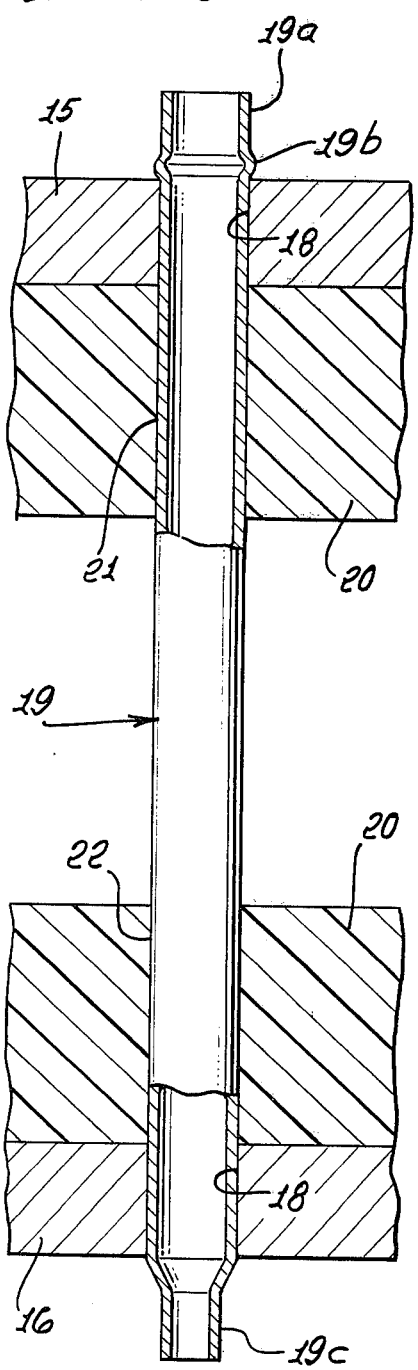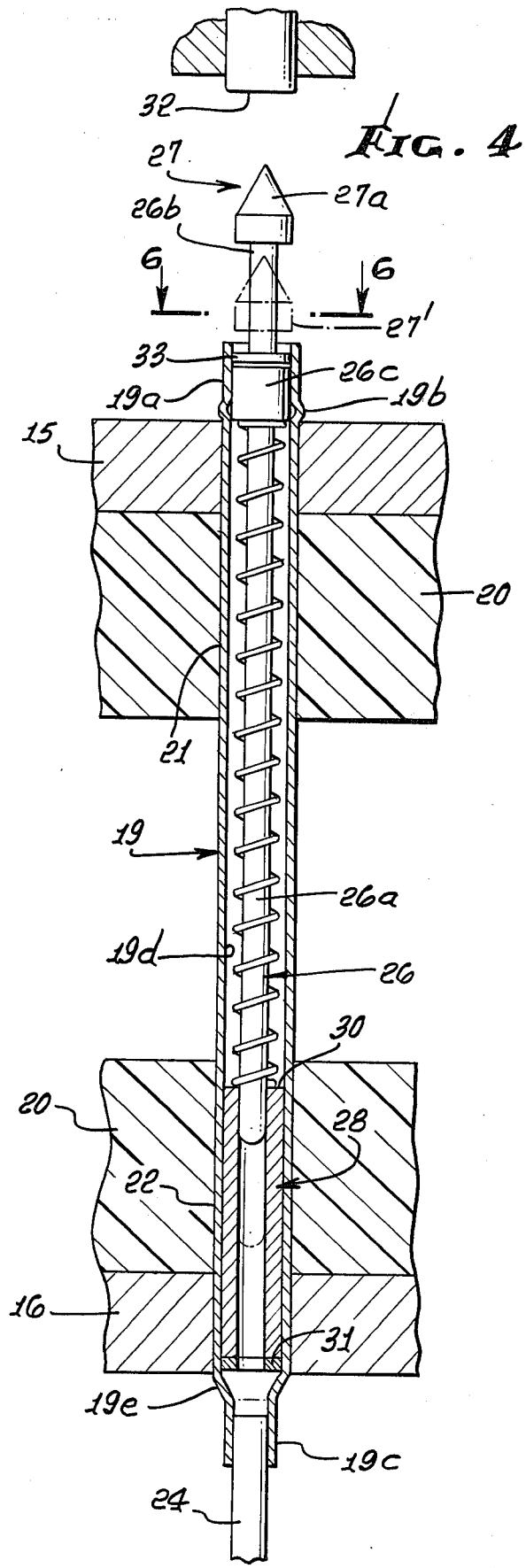

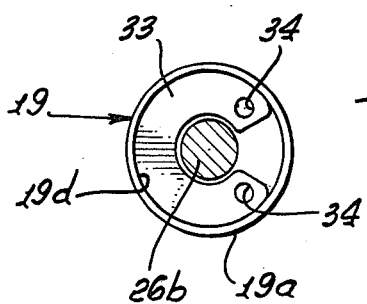
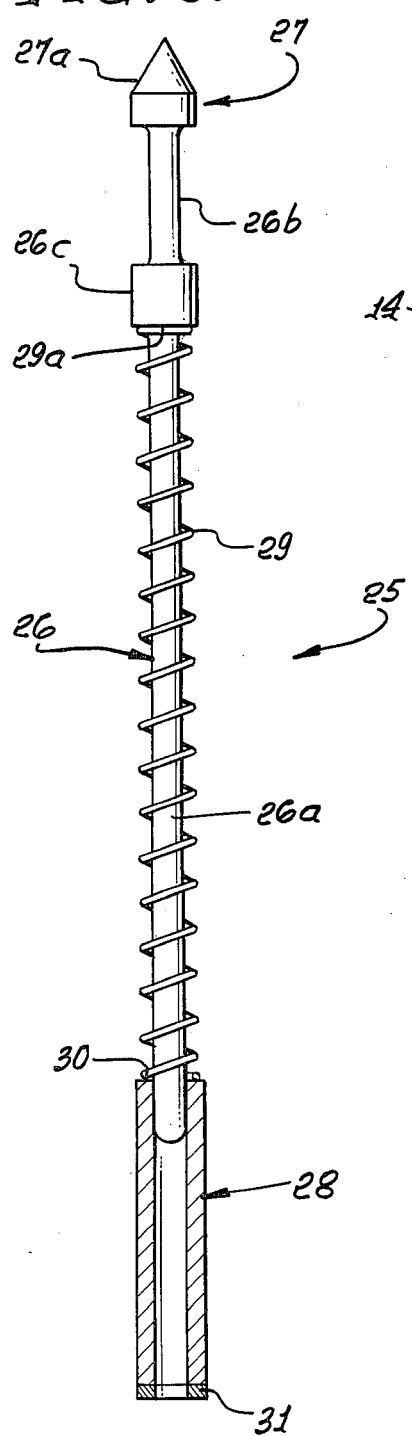
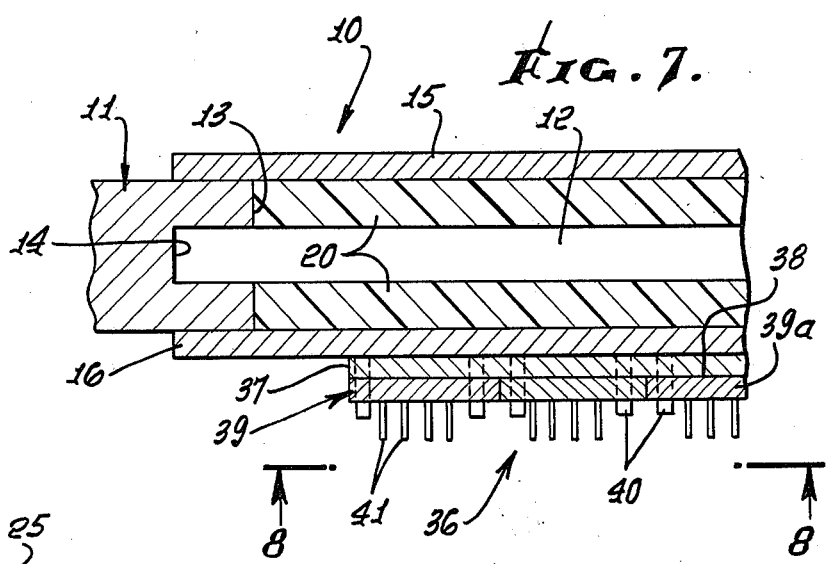
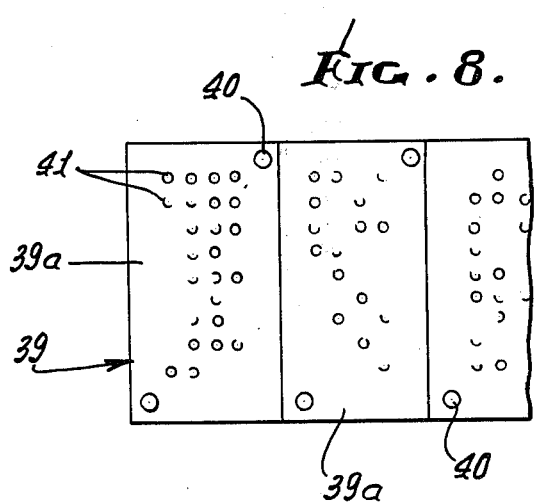
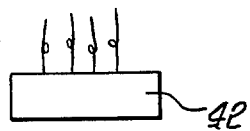

REPAIRABLE SPRING PROBE ASSEMBLY

This is a continuation of application Ser. No. 887,036, filed Mar. 16, 1978, now abandoned.

BACKGROUND OF THE INVENTION

This invention relates generally to testing of electronic circuitry, and more particularly concerns spring probes used in such testing.

In order to electrically test an electronic assembly, it is necessary to interconnect test points or circuits to appropriate connections on a test set. In testing printed circuit boards and other wired assemblies, this interconnection is usually accomplished through a "probing" operation. In its simplest form, probing is accomplished when a wire or probe is placed on a desired test point and a small amount of pressure is applied. Electrical contact is established and current flows through the probe to the test set and test results are observed.

In order to assure cost effective use of automatic test equipment (ATE), it is often required to make hundreds or thousands of test point interconnections within a few seconds. This is accomplished through use of a small device called a spring probe. As its name implies, a spring probe contains a spring and is used to probe electronic circuits. Basically, the spring mechanism allows the probe tip or plunger to be slightly displaced into the body of the probe when the test object is placed against the probe tip. Such spring action accomplishes two things:

(1) The spring tension applies the proper amount of force (2 to 4 oz. for example) to establish and maintain electrical connection with the contacted surface, and
 (2) The probe tip displacement (0.125 inch for example) compensates for small irregularities in the surface area contacted.

As can be seen, any number of spring probes can be fixtured to any desired pattern and all can be engaged or disengaged through a single operation.

Spring probes are typically mounted in an insulator board in a pattern that corresponds to the geometry of the test object. Each desired test point has a correspondly probe and all probes are wired through a connector arrangement to a test set. The insulator board, spring probes and associated wiring are referred to as a "test fixture" because the pattern is fixed to the geometry of a particular test object. In general, insulator boards are removeable within a fixture so that multiple products can be tested with a common test set.

Due to electrical and mechanical failures, and occasional damage, it is highly desirable and usually required that spring probes be replaceable within a fixture. With present designs this is accomplished using a separate assembly called a socket or receptacle. Sockets are formed such that a wire or wire terminal can be attached to one end while the other end serves as a receptacle for a spring probe. Sockets are wired and become permanent to the fixture, whereas the spring probes do not. Due to present methods of construction, spring probe assemblies are non-repairable and are usually discarded when replaced.

Most manufacturers also offer what is called a "non-replaceable" spring probe that incorporates a probe/socket combination in a single enclosure. The design is identical to the replaceable probe, except that provisions are made for attaching a wire or wire terminal directly to the probe's enclosure. This version has cost advantages (one assembly vs. two) over the replaceable design, but has a decided disadvantage in maintenance. When failures or damages occur, the user must go to considerable expense and time delay in repairing the fixture. Wires must be disconnected, assemblies knocked or drilled out, etc. Due to the small parts and close tolerances, repair work frequently results in more failures induced than corrected. For this reason, the replaceable probe is more in demand than the less expensive non-replaceable version.

SUMMARY OF THE INVENTION

It is major object of the invention to provide a simple, effective spring probe assembly that overcomes disadvantages and problems with prior units, in the manner as will be seen. Basically, it is adapted for insertion in a tubular housing as may be incorporated in an insulated board, the assembly comprising:

(a) a vertically elongated plunger and a contact head at one end of the plunger,
 (b) an enlargement on the plunger to slidably fit a bore defined by the tubular housing,
 (c) a sleeve slidably receiving the opposite end of the plunger, the sleeve sized to closely fit the bore of the housing, and
 (d) a compression spring on the plunger and located between the enlargement and the sleeve to yieldable urge the plunger in a direction toward the head.

Accordingly, the assembly may consist of only two metal parts and a spring assembled inside a metal enclosure, the parts being designed to be captivated such that they are easily dismantled and reassembled for purposes of cleaning, repair and/or replacement. Since the probe mechanism is repairable, it can be incorporated in a socket or housing enclosure and wired in a fixture, and should failure or damage occur, parts are easily dismantled for repair or replacement. Accordingly, the design incorporates the advantages of a replaceable probe with the economy and performance of a non-replaceable unit.

Further, the invention may be considered to employ two important principles in spring probe design:

(1) the plunger shaft is extended down and inside a sleeve or guide, and
 (2) the method of captivating the parts inside an enclosure is such that the mechanism is easily dismantled and reassembled.

In addition, the plunger and sleeve arrangement provides a basic sub-assembly that does not rely upon an enclosure for mechanical strength or containment. In this regard, the shaft/sleeve mechanism is extremely rigid even though it has no enclosure, whereas conventional designs cannot be assembled unless there is an enclosure. Additionally, a captivating device on the plunger shaft is easily removed by pulling the assembly apart, enabling parts to be easily dismantled, and then reassembled. In conventional designs, parts are captivated inside the enclosure by means of a crimping or rolling operation on the enclosure wall. These deformations are practically impossible to remove and reinstate, so that the enclosure and concomitant assembly is considered non-repairable.

The shaft to sleeve coupling also has greatly improved electrical properties over conventional designs. These results from the fact that the integral parts of the probe assembly are all electrically interconnected by large contact surface areas. Contact between parts is further improved with a wiping action between the shaft inside the sleeve as well as between the shaft and spring coils, the wiping action occurring as the plunger is displaced, and again as it is released. As contrasted with this, in conventional designs current flow is from the probe parts through an enclosure. This "circuit" includes the inside and outside wall surfaces of the probe enclosure which has little or no wiping action in a replaceable probe/socket configuration. Since a separate enclosure is not needed in applicant's improved design, the added series circuit of prior designs is effectively eliminated or rendered less important.

The coupling also provides significant improvements in the mechanical properties of spring probes. These include better distribution of side loading forces, the latter resulting from horizontal components of forces applied to the plunger tip. In conventional designs, these undesired forces cause excessive wear by forcing the plunger against the enclosure wall during plunger displacement. With the shaft to sleeve coupling of the present invention, these forces are transmitted to the sleeve through the moment arm of the shaft. Thus, the mechanical advantage of the shaft is used to counteract the force. The result is a higher degree of damage resistance and extended probe life due to less wear between plunger and enclosure.

Another significant improvement lies in the decrease of the minimum center line spacing between probes. By eliminating the outer enclosure in replaceable probes, the minimum distance between probes is decreased by an amount twice the wall thickness, plus allowances for plating and press fitting. Probes can therefore be placed closer together (with a given diameter probe) or the probe can be larger for a given spacing. This feature has a significant impact on both cost and performance when close tolerances of contacts on 0.050 inch centers (for example) are encountered.

These and other objects and advantages of the invention, as well as the details of an illustrative embodiment, will be more fully understood, from the following description and drawings, in which:

DRAWING DESCRIPTION

FIG. 1 is a plan view of an insulation board embodying the invention;

FIG. 2 is a section on lines 2—2 of FIG. 1;

FIG. 3 is an enlarged section taken in elevation on lines 3—3 of FIG. 2;

FIG. 4 is a view like FIG. 3, but showing a retrievable spring probe assembly in a barrel as shown in FIG. 3;

FIG. 5 is an elevation showing the retrievable spring probe assembly prior to insertion in the barrel of FIG. 3;

FIG. 6 is a plan view on lines 6—6 of FIG. 4;

FIG. 7 is a section like that of FIG. 2, showing a modification;

FIG. 8 is an elevation taken on lines 8—8 of FIG. 7; and;

FIG. 9 is a view of a test set.

DETAILED DESCRIPTION

In FIGS. 1 and 2, an insulator board 10 includes a frame 11 which may be rectangular, and which defines a central, typically rectangular, opening 12. In this regard, the frame inner periphery 13 may be recessed as at 14, the recess extending about the opening 12.

The board 10 also includes upper and lower horizontal plates 15 and 16 which are vertically spaced apart. Such plates may be suitably attached to the upper and lower flat sides of the frame, as at 17. The plates may be electrically insulative.

Openings or bores 18 are drilled or formed in the plates to receive vertically extending tubular housings 19, which are in turn adapted to receive the spring probe assemblies to be described. The housings may for example have press fit attachment to the plates, at bores 18. In addition, the housings preferably are secured in position by insulative material 20 located between the plates and bonded to intermediate portions of the housings, as at locations 21 and 22. Material 20 may advantageously consist of synthetic resin such as epoxy resin formed in vertically spaced layers as shown. The lower layer may be formed first, as by pouring resin against the innerside of lower plate 16, and prior to placement of upper plate 15 in the position shown. After curing of the lower layer, the upper plate 15 may be affixed in position, the board inverted, and an opening 23 formed in the lower plate 16 and lower layer 20. Resin may then be passed through that opening and against the innerside of plate 15 (in lower position) whereby the upper layer 20 is formed. Opening 23 may then be plugged as at 23a. Accordingly, all the tubular housings 19 are rigidly attached to the board 10. If desired, the resin may be filled into space 12 to fill recess 14 and lock to the frame, as at 100 in FIG. 2.

Extending the description to FIGS. 3 and 4, it will be seen that the barrel or housing 19 typically protrudes at 19a above the upper plate. Further, an expanded ring portion 19b of the barrel engages the top of the plate 15 to limit downward initial insertion or reception of the barrel 19 into the plates 15 and 16. The lowermost portion 19c of the barrel is reduced in cross-section to receive a wire wrap pin 24, via which a wire connection is made to another terminal, as will be described.

Referring to FIG. 5, the spring probe assembly or sub-assembly 25 includes a vertically elongated plunger 26 characterized by a vertically and axially elongated lower section 26a, and a vertically and axially elongated upper section 26b. The latter is substantially shorter than the former, and separated therefrom by a cylindrical enlargement 26c integral with the plunger. The enlargement is sized to wipe-contact the bore 19d of the tubular housing, affording an electrical contact path between the plunger and enclosure as the plunger moves up and down in the enclosure. A contact head 27 is integral with the plunger at its upper end, and includes a tapered end portion 27a adapted to engage an electrical contact to be tested. The head, plunger and enlargement may all consist of electrically conductive material such as aluminum, copper, etc. Sections 26a and 26b are of reduced diameter in order to avoid rubbing contact with bore 19d, thereby reducing frictional resistance to movement of the plunger.

A vertically elongated guide sleeve 28 receives the lowermost portion of the plunger, to have wipe-contact therewith, and a compression spring 29 is received on plunger portion 26a to tend to urge the plunger and sleeve in relatively opposite directions. In this regard, the spring and sleeve may also consist of electrically conductive material to provide additional electrical paths between the plunger and enclosure 19. The upper end of the spring typically engages the lower portion of the enlargement, i.e. at 29a, and the lower end of the spring typically engages the upper end of the sleeve at 30.

The sleeve also has close sliding fit, i.e. electrical contact with the enclosure bore 19d, as seen in FIG. 4. Also, a small ring 31 may be located at the lower end of the sleeve, and may tightly engage bore 19d to act as a stop engaged by the bottom end of the sleeve. In this regard, the reducing, i.e. tapered, lower end portion 19d of the enclosure locates the ring, or the lower end of the sleeve in case the ring is omitted. Spring 29 serves to urge the probe plunger toward up-position as seen in solid lines in FIG. 4. A contact is shown at 32 to be relatively displaced toward the head, urging it downwardly toward lower position indicated by broken lines 27'.

An important feature concerns the provision of means 33 at one end, (i.e. the upper end for example) of the housing 19 to releasably retain the enlargement 26c in the housing, whereby the probe in uppermost position remains urged upwardly by the spring 29. Also, the probe sub-assembly 25 as shown in FIG. 5 is easily removed from the housing 19, for replacement or repair, after simple removal of the means 33 from the housing. That means 33 may advantageously comprise a C-ring tightly fitting the bore 19d of the housing, as is clear from FIG. 6. Ring 33 has loose sliding fit with plunger upper section 26b. If desired, a small annular recess may be formed in bore 19d to receive the outermost portion of the ring. The ring is easily removed from the bore as by a tool interfitting small openings 34 in the ring ends, whereby the ring may be radially inwardly deflected to disengage bore 19d.

FIGS. 7 and 8 illustrate terminal means 36 to which the wire wrap pins 24 may be connected, as by hand wiring, and to which the other electrical circuitry may be connected. Such means may include a "mother board" 37 attached as by bonding at 38 to lower plate 16, and terminal modules 39 attached to board 37. Located pins 40 may be carried by board 37 to penetrate corresponding locating openings at the corners of the module plates 39a. The latter typically carry rows and columns of terminal pins 41, to which pins 24 are wired. The precise location of the pins 41 enables programmed connections of wires to them, as by known wire wrap machines.

Pins 41 may be appropriated wired to a test set, indicated at 42 in FIG. 9.

FIG. 2 also shows the support of housing 19 as by plates 43 and 44, as during application of loads from multiple contacts. Accordingly, loading is not transferred to the frame 11.

I claim:

1. In combination with a tubular housing to be assembled on an insulator board, a spring probe assembly comprising
   (a) a vertically and axially elongated plunger and a contact head at one end of the plunger,
   (b) the plunger having an enlargement slidably fitting an inner wall defined by the tubular housing,
   (c) retainer means located at the inner wall of the tubular housing and proximate one end portion of the housing to releasably retain the enlargement in the housing, and
   (d) a compression spring on the plunger and located in said housing bore between said enlargement and structure in the housing to yieldably urge said plunger in a direction toward said head, the spring being electrically conductive,
   (e) one end of the housing remaining circularly open across a diameter at least as large as the outer diameter of the enlargement, the housing having uniform, wall thickness throughout the majority of its length between the spring and said open one end,
   (f) said retainer means being axially spaced from and accessible through said open one end of the housing, and being radially deflectible to permit pull-out withdrawal of said plunger and enlargement, the housing inner wall at said open end acting as a guide for axial movement of said enlargement in the housing and through said end.

2. The probe assembly of claim 1 wherein the plunger has an opposite end remote from said one end, and including a sleeve closely fitting the inner wall of the housing and located to slidably receive the opposite end of the plunger.

3. The probe assembly of claim 2 wherein said head is closer to said enlargement than said sleeve.

4. The probe assembly of claim 1 wherein said plunger has a shank which is locally enlarged to form said enlargement.

5. The probe assembly of claim 1 wherein said means locally projects inwardly of said inner wall of the tubular housing, in spaced relation to said open one end of the housing.

6. The probe assembly of claim 1 wherein said means comprises a C-ring fitting the inner wall of said housing.

7. The probe assembly of claim 2 wherein the housing has an opposite end with a reduced bore to locate said sleeve.

8. The probe assembly of claim 2 including an insulator board carrying said housing.

9. The probe assembly of claim 8 wherein the board includes synthetic resin cured in contact with the exterior of said housing, to integrate the housing and board.

10. The combination that includes the board and probe assembly of claim 8, and additional like probe assemblies and housings therefor carried by the board, said assemblies having generally parallel axes.

11. The combination of claim 10 including a mother board carried by said insulator board, and terminal boards carried by the mother board at predetermined locations, there being terminal pins in rows and columns on the terminal boards and adapted to be wire-connected to terminal pins associated with said probe assemblies.

* * * * *